United States Patent [19]
Harms et al.

[11] Patent Number: 5,589,000
[45] Date of Patent: Dec. 31, 1996

[54] FIXTURE FOR DEPOSITION

[75] Inventors: Michael R. Harms, Woodbury; Richard J. Foss, Pine City; Jennifer L. Trice, Eagan; Terence D. Neavin, St. Paul, all of Minn.

[73] Assignee: Minnesota Mining and Manufacturing Company, St. Paul, Minn.

[21] Appl. No.: 524,340

[22] Filed: Sep. 6, 1995

[51] Int. Cl.⁶ ........................................... C23C 16/00
[52] U.S. Cl. .................... 118/715; 118/725; 118/729; 118/724
[58] Field of Search .................... 118/725, 729; 427/1

[56] References Cited

U.S. PATENT DOCUMENTS 3,636,919   1/1972   Bozler .................................. 118/48

FOREIGN PATENT DOCUMENTS

| 2845131 | 4/1980 | Germany | C23C 13/10 |
| 49-26908 | 7/1974 | Japan | G03G 5/02 |
| 3-29959 | 2/1991 | Japan | G03G 5/082 |
| 6-330320 | 11/1994 | Japan | C23C 14/56 |
| 807201 | 2/1981 | U.S.S.R. | G03G 5/02 |
| 1095126 | 5/1984 | U.S.S.R. | G03G 5/02 |

*Primary Examiner*—Robert Kunemund
*Assistant Examiner*—Felisa Garrett
*Attorney, Agent, or Firm*—Gary L. Griswold; Walter N. Kirn; Steven J. Shumaker

[57] ABSTRACT

A fixture and method for use in deposition of a material over a substrate make use of an apparatus for actively heating and cooling the substrate during the deposition process. The active heating and cooling structure enables careful control of the temperature of the substrate, and can provide rapid temperature adjustment in response to temperature variation. The fixture and method are thereby capable of accelerating the overall deposition process. The fixture and method also make use of structure for reducing warpage in the fixture during the deposition process due to thermal gradients. By reducing the susceptibility of the fixture to warpage and providing improved temperature control, the fixture and method enable fabrication of layers with more consistent characteristics.

21 Claims, 3 Drawing Sheets

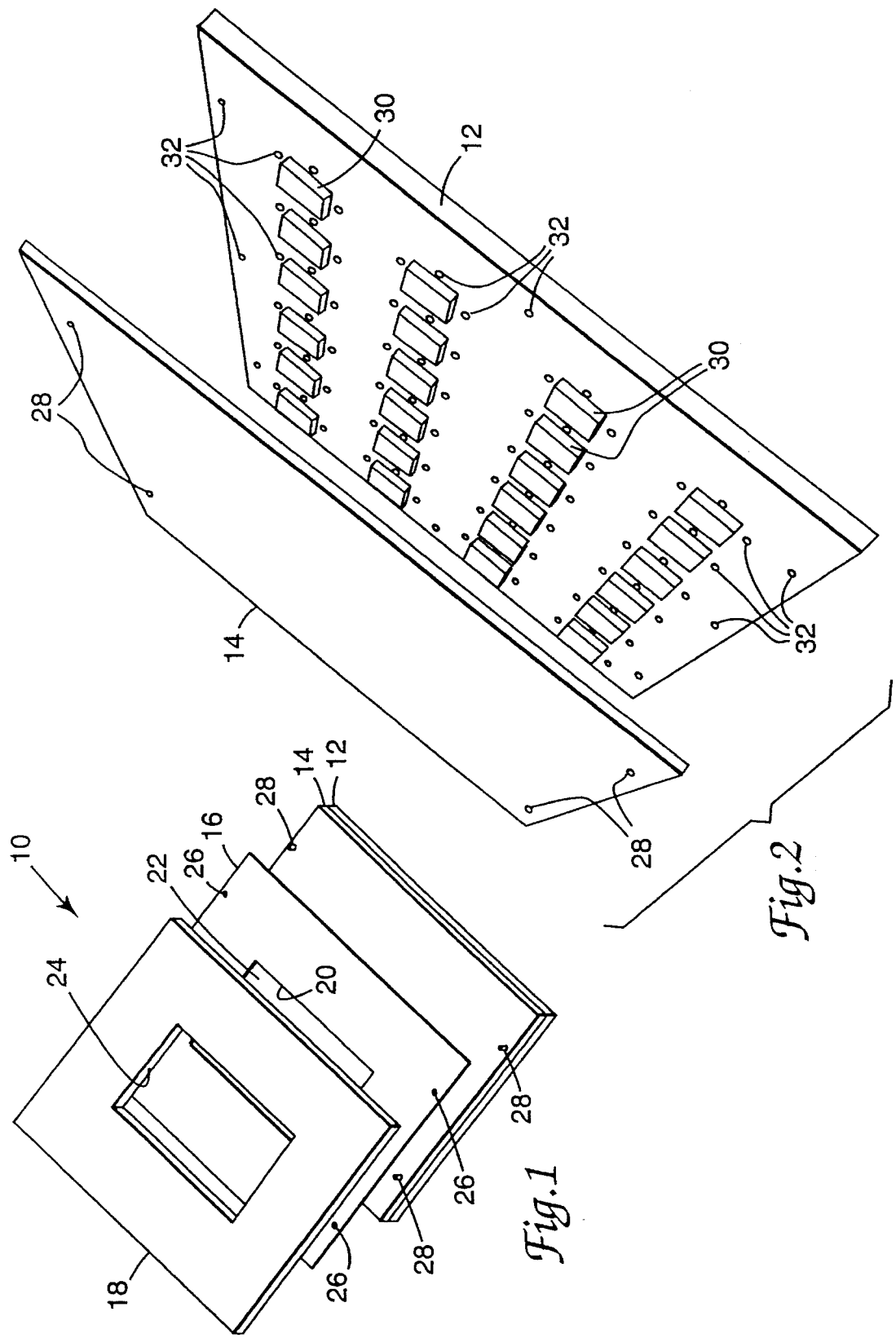

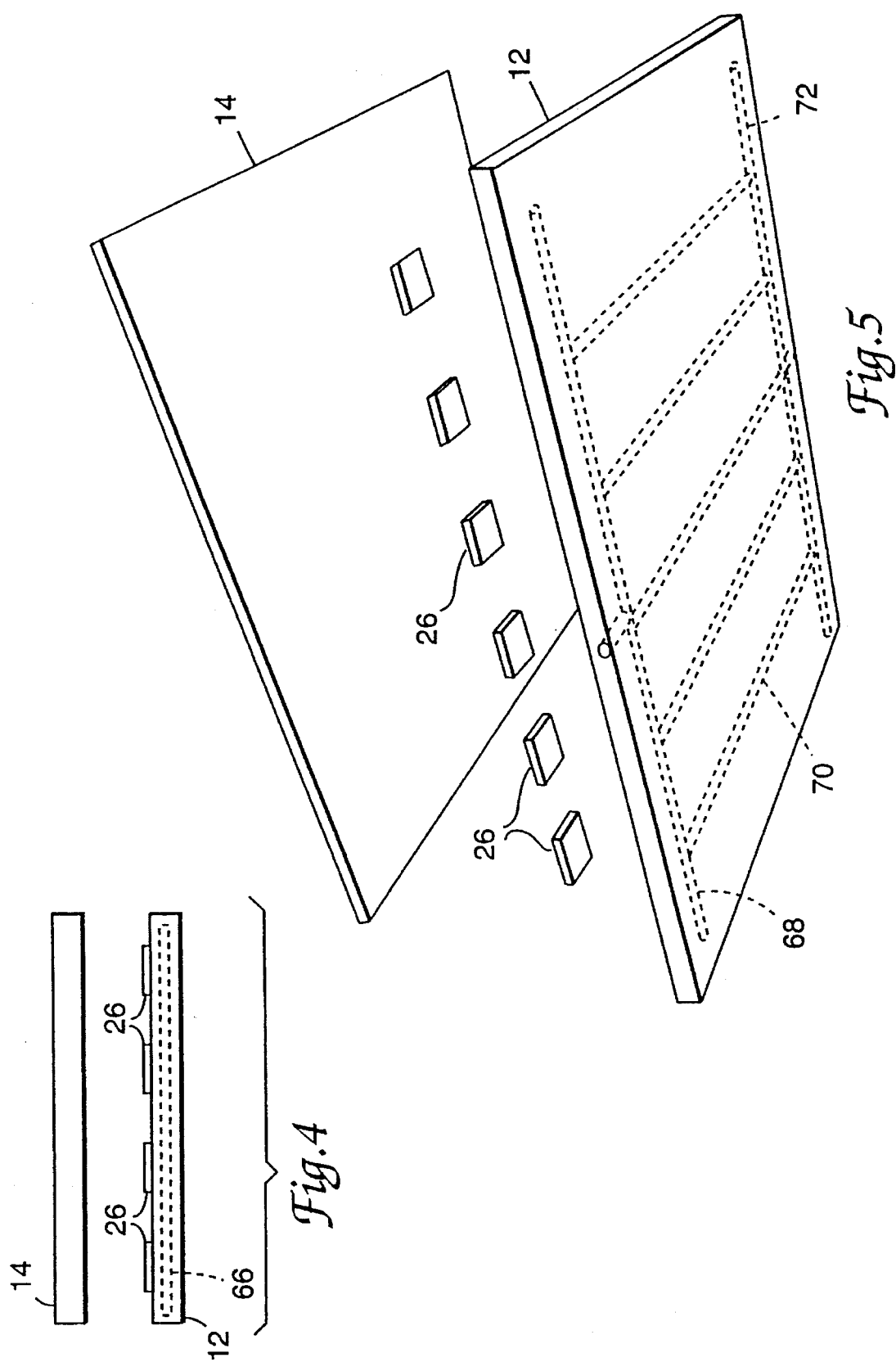

FIXTURE FOR DEPOSITION

FIELD OF THE INVENTION

The present invention relates generally to material deposition processes and, more particularly, to fixtures for deposition of a material over a substrate.

DISCUSSION OF RELATED ART

Semiconductor devices are formed, in part, by the deposition of layers of various materials over a substrate. Vapor deposition is one well known process for depositing a material over a substrate. For vapor deposition, the substrate is mounted on a fixture in a vacuum chamber. The material to be deposited is placed in a tray in the vacuum chamber. The substrate is first heated and then allowed to passively cool. After the substrate is cooled, the material to be deposited is heated to a high temperature sufficient to cause evaporation of the material. The evaporated material is attracted to the cool substrate, forming a coating over the substrate. The substrate is again allowed to passively cool prior to removal from the fixture. The entire vapor deposition process, including the time required for passive cooling, can take several hours.

Unfortunately, existing vapor deposition process can produce coatings having inconsistent characteristics. The inconsistent characteristics generally result from nonuniformity of deposition of the material across the surface area of the substrate. The nonuniformity may include, for example, nonuniform thickness and nonuniform density of the deposited material across the substrate. The nonuniformities can occur between different substrates in a single lot, and between different regions of a single substrate. Nonuniformity is particularly troublesome for deposition of materials over substrates having large surface areas. The inconsistent characteristics caused by such nonuniformities in thickness and density may include, for example, inconsistent electrical characteristics in the case of vapor deposited metal, semiconductor, or insulative materials, inconsistent radiation sensitivity characteristics in the case of vapor deposited radiation sensitive materials such as selenium, and inconsistent thermal characteristics in the case of vapor deposited materials having highly temperature-dependent performance characteristics.

The nonuniformities in thickness and density of the vapor deposited material can occur due to warpage in the substrate fixture and inadequate temperature control during the vapor deposition process. Fixture warpage can be caused by the rigid connection of components with different coefficients of thermal expansion to form the fixture. The temperature gradients induced by high temperature sublimation to clean the fixture between successive vapor deposition processes can cause differential thermal expansion and resulting warpage of the fixture components. Fixture warpage causes nonuniformity of thermal contact between the fixture and the substrate, leading to nonuniformities in the thickness and density of the material deposited on the substrate.

Inadequate control of the substrate temperature during the vapor deposition process also can lead to nonuniform thickness and density of the deposited material. In particular, temperature variations across the surface area of the substrate can cause differential deposition of material in different regions of the substrate. Temperature variations during different vapor deposition cycles can cause differential deposition between different substrates in a single lot. Further, temperature variations can affect the performance characteristics of the vapor deposited material. For example, radiation sensitive materials such as selenium have sensitivity characteristics that can vary as a function of the fusion temperature applied to the material. Imprecise temperature control can cause deviation from the proper fusion temperature window, resulting in inconsistent sensitivity characteristics.

SUMMARY OF THE INVENTION

In view of the inconsistent characteristics that can result from deposition of materials using existing deposition processes such as vapor deposition, the present invention is directed to a substrate fixture and method for realizing an improved deposition process. In one embodiment, the fixture and method of the present invention make use of an apparatus for actively heating and cooling the substrate during the deposition process to enable enhanced temperature control across a single substrate and between different substrates, and rapid temperature adjustment in response to temperature variation. As another advantage, the active cooling afforded by the fixture and method of the present invention can accelerate the overall deposition process. The fixture and method also make use of a fixture structure for reducing warpage in the fixture during the deposition process due to thermal gradients. By reducing the susceptibility of the fixture to warpage and providing improved temperature control, the fixture and method of the present invention enable deposition of materials with more consistent characteristics.

In a first embodiment, the present invention provides a fixture for use in deposition of a material over a substrate, the fixture comprising a first plate, a second plate for supporting the substrate during deposition of the material over the substrate, the substrate being supported on a side of the second plate opposite the first plate, a plurality of thermoelectric devices disposed between the first plate and the second plate, the thermoelectric devices being in thermal communication with both the first plate and the second plate, and a device for controlling each of the thermoelectric devices to generate thermal energy sufficient to substantially maintain a desired temperature of the substrate during deposition of the material over the substrate, wherein a portion of the thermal energy is transferred to the substrate by the second plate and a portion of the thermal energy is transferred away from the thermoelectric devices by the first plate.

In a second embodiment, the present invention provides a method for depositing a material over a substrate, the method comprising the steps of providing a first plate and a second plate, providing a plurality of thermoelectric devices between the first plate and the second plate, the thermoelectric devices being in thermal communication with the first plate and the second plate, placing the substrate on a surface of the second plate opposite the first plate, depositing the material over the substrate, and controlling each of the thermoelectric devices to generate thermal energy sufficient to substantially maintain a desired temperature of the substrate during deposition of the material over the substrate, wherein the thermal energy is transferred to the substrate by the second plate and the thermal energy is transferred away from the thermoelectric devices by the first plate.

In a third embodiment, the present invention provides a fixture for supporting a substrate during deposition of a material over the substrate, the fixture comprising a first plate, a second plate for supporting the substrate during deposition of the material over the substrate, the substrate being supported on a side of second plate opposite the first plate, a third plate disposed adjacent the second plate and opposite the first plate, the third plate including a first aperture for receiving the substrate, and a fourth plate disposed adjacent the third plate and opposite the second plate, the fourth plate including a second aperture for exposing the substrate for deposition of the material, wherein the fourth plate masks a portion of the substrate from deposition and holds the substrate against the second plate.

The advantages of the fixture and method of the present invention will be set forth in part in the description that follows, and in part will be apparent from the description, or may be learned by practice of the present invention. The advantages of the apparatus and method of the present invention will be realized and attained by means particularly pointed out in the written description and claims, as well as in the appended drawings. It is to be understood, however, that both the foregoing general description and the following detailed description are exemplary and explanatory only, and not restrictive of the present invention, as claimed.

BRIEF DESCRIPTION OF THE DRAWINGS

FIG. 1 is an exploded perspective view of a fixture for deposition of a material over a substrate, in accordance with the present invention;

FIG. 2 is an exploded perspective view of a portion of the fixture of FIG. 1, further illustrating a temperature control apparatus, in accordance with the present invention;

FIG. 4 is an exploded side view of a portion of the fixture of FIG. 2 modified to include a phase change material, in accordance with the present invention; and FIG. 5 is an exploded perspective view of a portion of the fixture of FIG. 2 modified to include a liquid cooling system, in accordance with the present invention.

DETAILED DESCRIPTION OF THE PREFERRED EMBODIMENTS

Figure 3:
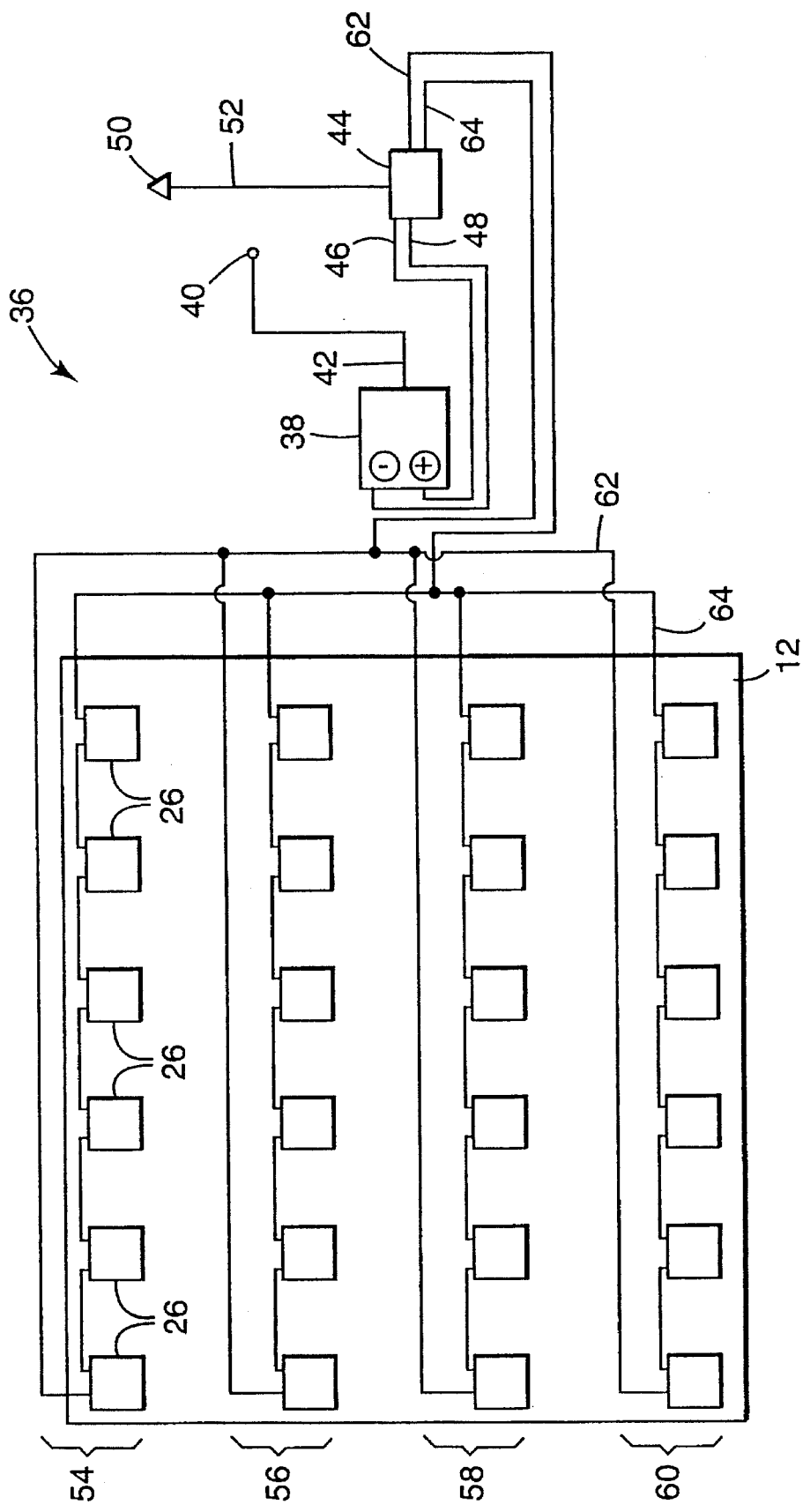
FIG. 3 is a functional block diagram illustrating an exemplary system for controlling the temperature control apparatus shown in FIG. 2, in accordance with the present invention.

FIG. 1 is an exploded perspective view of a fixture 10 for deposition of a material over a substrate, in accordance with the present invention. As shown in FIG. 1, fixture 10 includes a first plate 12, a second plate 14 disposed adjacent the first plate, a third plate 16 disposed adjacent the second plate and opposite the first plate, and a fourth plate 18 disposed adjacent the third plate and opposite the second plate. The entire fixture 10 may be mounted on a support stand (not shown) within a vacuum chamber.

The third plate 16 defines a first aperture 20 for receiving a substrate 22. The first aperture 20 serves to locate substrate 22 within fixture 10. The substrate 22 is mounted within first aperture 20 and supported by second plate 14. The fourth plate 18 includes a second aperture 24 that exposes a portion of substrate 22 for deposition of a material by, for example, vapor deposition. The second aperture 24 is sized smaller than substrate 22. As a result, fourth plate 18 masks a small portion of substrate 22 from deposition and serves to hold the substrate against second plate 14.

As further shown in FIG. 1, third plate 16 can be mounted to second plate 14 with, for example, a plurality of screw holes 26, 28 provided in the third plate and second plate, respectively. Third plate 16 preferably is mounted to second plates 14 with a small number of screws, however, to enable quick removal of the third plate for sublimation between successive deposition processes, if desired. The first and second plates 12, 14 are mounted together via a plurality of additional screw holes (not shown in FIG. 1). The screws used to couple first and second plates 12, 14 and second and third plates 14, 16 can be provided with spring washers to more readily accommodate thermal expansion and contraction of the plates 12, 14, 16 during the deposition process.

The first, second, and third plates 12, 14, 16 preferably are made from a common material such as, for example, aluminum. Thus, first, second, and third plates 12, 14, 16, which are coupled together via the screws, share a common coefficient of thermal expansion. As a result, first, second, and third plates 12, 14, 16 tend to expand and contract together, and are much less susceptible to warpage that can cause nonuniformities during the deposition process.

The fourth plate 18 is used to mask and hold substrate 22 after placement of the substrate within aperture 20 of third plate 16. The fourth plate 18 therefore is made separable from fixture 10 for placement of a new substrate 22. The perimeter of fourth plate 18 can be removably clamped to fixture 10 after placement of substrate 22 within first aperture 20 using, for example, a cam release or spring-loaded mechanism. The cam release or spring-loaded mechanism may be configured to provide a predetermined loading force to hold substrate 22 against second plate 14. The fourth plate 18 preferably is made of a rigid material such as, for example, stainless steel. The fourth plate 18 is designed to be sufficiently rigid to resist warpage during heating and cooling cycles. The rigidity of fourth plate 18 serves to more effectively transfer uniform holding pressure to substrate 22.

The second aperture 24 of fourth plate 18 frames the imaging area of substrate 22 for deposition of radiation sensitive material. The fourth plate 18 transfers substantially all of the clamping force between the fourth plate and fixture 10 to the masked periphery of substrate 22. The masking portion of fourth plate 18 also serves to substantially shield the inner components of fixture 10, i.e., first, second, and third plates 12, 14, 16, from the deposited material during the deposition process. Thus, fourth plate 18 may be the only component of fixture 10 that needs to be separated and sublimed for removal of the deposited material between deposition processes. It may be desirable to also remove third plate 16 between deposition processes, however, if the third plate becomes coated with the deposited material.

FIG. 2 is an exploded perspective view of a portion of fixture 10 of FIG. 1, further illustrating a temperature control apparatus, in accordance with the present invention. As shown in FIG. 2, a plurality of thermoelectric devices 30 are disposed between first plate 12 and second plate 14. The thermoelectric devices 30 can be mounted on first plate 12, for example, and can be arranged in an array across the surfaces of the first plate and second plate 14. The opposing major surfaces of thermoelectric devices 30 are in thermal communication with first plate 12 and second plate 14, respectively. Thus, first plate 12 and second plate 14 sandwich thermoelectric devices 30. Between adjacent thermoelectric devices 30, first plate 12 and second plate 14 do not contact one another. Rather, an air gap separates first plate 12 and second plate 14, preventing thermal short circuiting between the first and second plates. The thickness of the gap corresponds to the thickness of each of thermoelectric devices 30 and any conductive paste or sheeting with which the devices are mounted on first plate 12.

The first plate 12, second plate 14, and thermoelectric devices 30 together form an active heating and cooling apparatus for controlling the temperature of substrate 22 during deposition of a radiation sensitive material. The first and second plates 12, 14 preferably are formed from aluminum, but can be formed from other materials having high thermal conductivity. The first plate 12 is sufficiently thick to form a heat sink during a substrate cooling stage, transferring thermal energy generated by thermoelectric devices 30 away from second plate 14, substrate 22, and thermoelectric devices 30. The second plate 14 serves to transfer thermal energy from thermoelectric devices 30 to substrate 22 during a substrate heating stage. The first plate 12 and second plates 14 may include holes for coupling the first and second plate together with screws. FIG. 2 shows holes 32 formed in first plate 12. The holes may extend entirely through the thickness of first plate 12, and partially through the thickness of second plate 14. The use of spring washers with the screws inserted in the holes may be desirable to better accommodate thermal expansion and contraction of first plate 12 and second plate 14.

The thermoelectric devices 30 preferably are Peltier effect thermoelectric devices that together act as a heat pump. An example of a suitable commercially available Peltier thermoelectric device can be obtained as model number 95/071/040 from Nova Technology, of San Rafael, Calif. As is well known in the art, each of thermoelectric devices 30 includes several metal-semiconductor junctions. In response to the application of DC electric current to each thermoelectric device 26, thermal energy is generated at one junction and absorbed at the other. The result is a hot junction and a cold junction. Reversal of the polarity of the current causes the junctions to switch from hot to cold and cold to hot. The thermoelectric devices 30 are arranged to have one side of each junction adjacent first plate 12 and an opposite side of each junction adjacent second plate 14.

The net heating or cooling effect of the Peltier effect thermoelectric devices 30 with respect to substrate 22 is proportional to the amplitude and duration of the electric current applied to the devices. In a heating stage, current is applied with a polarity selected to heat second plate 14, thereby heating substrate 22. When cooling of substrate 12 is desired, the polarity of the electric current applied to thermoelectric devices 30 is reversed. In this cooling stage, first plate 12 sinks thermal energy from thermoelectric devices 30. The first plate 12 radiates some of the thermal energy to any support stand on which fixture 10 may be mounted, and stores the remaining thermal energy. If the electric current is applied with a constant amplitude, the duration of current application can be selected to achieve the desired heating effect. Alternatively, duration and amplitude of the current could be modulated to achieve a more rapid response.

FIG. 3 is a functional block diagram illustrating an exemplary system 36 for controlling the temperature control apparatus shown in FIG. 2, in accordance with the present invention. As shown in FIG. 3, system 36 includes a DC power supply 38 coupled to an AC source 40 via line 42. A reversible polarity controller 44 receives DC power from DC power supply 38, as indicated by lines 46, 48. The controller 44 operates to control the polarity and duration of electrical current applied to thermoelectric devices 30 in response to a temperature sensing device. The temperature sensing device senses at least one parameter indicative of a temperature of substrate 22 during deposition of the radiation sensitive material over the substrate.

In the example of FIG. 3, the sensing device comprises a thermocouple 50. The thermocouple 50 may be positioned to sense a temperature indicative of the temperature of substrate 22. The thermocouple 50 may comprise, for example, a foil-type thermocouple mounted on second plate 14 or on a non-deposition area of substrate 22. The thermocouple 50 produces an output signal indicative of the sensed temperature and transmits the output signal to controller 44, as indicated by line 52. In response to the output signal generated by thermocouple 50, controller 44 controls each of thermoelectric devices 30 to generate thermal energy sufficient to substantially maintain a desired temperature of substrate 22 during deposition of the radiation sensitive material over the substrate.

An example of a suitable controller 44 is the programmable reversible DC controller commercially available as model number 33-00 from Cool Corporation, of Minneapolis, Minn. The controller 44 is programmed to turn thermoelectric devices 30 on and off and to switch the polarity of the applied current based on the sensing of upper and lower temperature limits, as indicated by the output signal received from thermocouple 50. As shown in the example of FIG. 3, the thermoelectric devices 30 mounted on first plate 12 may comprise a four-by-six device array. The six thermoelectric devices 30 in each row of the array can be connected in series with one another to form device groups 54, 56, 58, 60. The controller 44 has output terminals 62, 64 that apply current to each of thermoelectric devices 30.

In operation, controller 44 monitors the output signals generated by thermocouple 50 to determine whether the temperature of substrate 22 is within an acceptable temperature window for a particular point in time during progression of the deposition process. If the temperature parameter falls below a lower temperature limit, controller 44 drives thermoelectric devices 30 via output terminals 62, 64 with a current having a polarity selected to transmit thermal energy from the thermoelectric devices to second plate 14 and substrate 22. The controller 44 continues to drive thermoelectric devices with current having the heating polarity until the output signal of thermocouple 50 indicates that the temperature parameter has exceeded the upper temperature limit. In response, controller 44 reverses the polarity of the applied current to actively cool substrate 22, transferring thermal energy from the substrate and second plate 14 to first plate 12, which acts as a heat sink.

The controller 44 continues to operate in the above manner throughout the deposition process, taking into account changes in the temperature window with different stages of the process. The manner in which controller 44 maintains a desired temperature for substrate 22 is described above in relatively simple terms. The operation of controller 44 could be readily modified to take advantage of other control techniques such as, for example, derivative control. The use of Peltier effect thermoelectric devices 30 with controller 44 to actively heat and cool substrate 22 enables rapid adjustments in the substrate temperature. The ability to actively drive substrate 22 to an appropriate temperature can produce the proper fusion temperature for the deposited material, providing more consistent characteristics. The faster response afforded by thermoelectric devices 30 and controller 44 enables reductions in the time required to perform the overall deposition process.

FIG. 4 is an exploded side view of a portion of fixture 10 of FIG. 2 modified to include a phase change material, in accordance with the present invention. To maintain a more constant substrate temperature during deposition, it may be desirable to add more thermal mass to the heat sinking first plate 12. By adding more thermal mass, more energy can be transferred, thereby increasing the cooling duration. FIG. 4 illustrates the incorporation of a pocket 66 of phase change material in first plate 12. The phase change material increases the energy storage capacity of first plate 12 without significantly increasing the size of the first plate. The phase change material may comprise, for example, eutectic salt. During cooling, a significant amount of thermal energy is used to change the phase change material from a solid phase to a liquid phase, thereby adding to the storage capacity of first plate 12.

FIG. 5 is an exploded perspective view of a portion of the fixture of FIG. 2 modified to include a liquid cooling system, in accordance with the present invention. The passage of a liquid, such as water, through first plate 12 can further enhance the thermal transfer ability of the first plate. The liquid cooling system shown in FIG. 5 includes an entrance header pipe 68, a plurality of flow channel pipes 70, and an exit header pipe 72, all of which can be integrally formed within first plate 12. In operation, the liquid cooling system can be turned on at all times, or can be selectively activated during cooling modes by controller 44. The liquid cooling system can be selectively activated by, for example, activating a pump associated with entrance header pipe 68 and a source of cooling liquid.

Having described the exemplary embodiments of the apparatus and method of the present invention, additional advantages and modifications will readily occur to those skilled in the art from consideration of the specification and practice of the invention disclosed herein. Therefore, the specification and examples should be considered exemplary only, with the true scope and spirit of the invention being indicated by the following claims.

What is claimed is:

1. A fixture for use in deposition of a material over a substrate, the fixture comprising:

a first plate having a first side and a second side;

a second plate having a first side and a second side, wherein the first side of the second plate faces the first side of the first plate, the second side of the second plate supporting the substrate during deposition of the material over the substrate;

a plurality of thermoelectric devices disposed between the first plate and the second plate, the thermoelectric devices being in thermal communication with both the first plate and the second plate; and a device for controlling each of the thermoelectric devices to generate thermal energy during deposition of the material over the substrate, wherein a portion of the thermal energy is transferred to the substrate by the second plate and a portion of the thermal energy is transferred away from the thermoelectric devices by the first plate.

2. The fixture of claim 1, further comprising a device for sensing at least one parameter indicative of a temperature of the substrate during deposition of the material over the substrate, wherein the controlling device controls each of the thermoelectric devices in response to the parameter sensed by the sensing device.

3. The fixture of claim 2, wherein the device for sensing the at least one parameter indicative of the temperature of the substrate includes a temperature sensing device positioned adjacent one of the second plate and the substrate.

4. The fixture of claim 1, wherein each of the thermoelectric devices is a Peltier effect thermoelectric device, and the controlling device controls a polarity of electric current applied to each of the Peltier effect thermoelectric devices to heat and cool the substrate.

5. The fixture of claim 1, wherein the thermoelectric devices are arranged in an array across a surface of the first plate and the second plate.

6. The fixture of claim 1, further comprising a third plate disposed adjacent the second plate and opposite the first plate and the thermoelectric devices, the third plate including a first aperture for receiving the substrate, and a fourth plate disposed adjacent the third plate and opposite the second plate, the fourth plate including a second aperture for exposing the substrate for deposition of the material, wherein the fourth plate masks a portion of the substrate from deposition and holds the substrate against the second plate.

7. The fixture of claim 6, wherein the fourth plate comprises stainless steel.

8. The fixture of claim 6, wherein the fourth plate and the second aperture are sized such that the fourth plate shields the first plate, the second plate, and the thermoelectric devices from the material.

9. The fixture of claim 1, wherein the first plate includes a phase change material that changes phase in response to transfer of thermal energy by the first plate, the phase change material enhancing the transfer of thermal energy by the first plate.

10. The fixture of claim 1, further comprising a plurality of ports formed in the first plate, and means for passing liquid through the ports to enhance the transfer of thermal energy by the first plate.

11. The fixture of claim 1, wherein the material is a radiation sensitive material.

12. The fixture of claim 11, wherein the radiation sensitive material is selenium.

13. The fixture of claim 1, wherein the fixture is mounted in a vapor deposition chamber, the material being vapor deposited over the substrate.

14. A fixture for supporting a substrate during deposition of a material over the substrate, the fixture comprising:

a first plate having a first side and a second side;

a second plate having a first side and a second side, wherein the first side of the second plate faces the first side of the first plate, the second side of the second plate supporting the substrate during deposition of the material over the substrate;

a third plate disposed adjacent the second plate and opposite the first plate, the third plate including a first aperture for receiving the substrate; and a fourth plate disposed adjacent the third plate and opposite the second plate, the fourth plate including a second aperture for exposing the substrate for deposition of the material, wherein the fourth plate masks a portion of the substrate from deposition and holds the substrate against the second plate.

15. A fixture for use in deposition of a material over a substrate, the fixture comprising:

a first plate having a first side and a second side;

a second plate having a first side and a second side, wherein the first side of the second plate faces the first side of the first plate, the second side of the second plate supporting the substrate during deposition of the material over the substrate;

a plurality of thermoelectric devices disposed between the first plate and the second plate, the thermoelectric devices being in thermal communication with both the first plate and the second plate.

16. The fixture of claim 15, wherein the thermoelectric devices are arranged in an array across a surface of the first plate and the second plate.

17. The fixture of claim 15, further comprising a third plate disposed adjacent the second plate and opposite the first plate and the thermoelectric devices, the third plate including a first aperture for receiving the substrate, and a fourth plate disposed adjacent the third plate and opposite the second plate, the fourth plate including a second aperture for exposing the substrate for deposition of the material, wherein the fourth plate masks a portion of the substrate from deposition and holds the substrate against the second plate.

18. The fixture of claim 17, wherein the fourth plate comprises stainless steel.

19. The fixture of claim 17, wherein the fourth plate and the second aperture are sized such that the fourth plate shields the first plate, the second plate, and the thermoelectric devices from the material.

20. The fixture of claim 15, wherein the first plate includes a phase change material that changes phase in response to transfer of thermal energy by the first plate, the phase change material enhancing the transfer of thermal energy by the first plate.

21. The fixture of claim 15, further comprising a plurality of ports formed in the first plate, and means for passing liquid through the ports to enhance the transfer of thermal energy by the first plate.

* * * * *